(12) United States Patent
Theoduloz et al.

(10) Patent No.: US 7,843,737 B2
(45) Date of Patent: Nov. 30, 2010

(54) DEVICE FOR READING A LOW-CONSUMPTION NON-VOLATILE MEMORY AND ITS IMPLEMENTING METHOD

(75) Inventors: Yves Theoduloz, Yverdon (CH); Hugo Jaeggi, Fontaines (CH); Nadia Harabech, Marin (CH)

(73) Assignee: EM Microelectronic-Marin S.A., Marin (CH)

( * ) Notice: Subject to any disclaimer, the term of this patent is extended or adjusted under 35 U.S.C. 154(b) by 135 days.

(21) Appl. No.: 12/342,005

(22) Filed: Dec. 22, 2008

(65) Prior Publication Data

US 2009/0175074 A1    Jul. 9, 2009

(30) Foreign Application Priority Data

Dec. 21, 2007  (EP)  .................................. 07150366

(51) Int. Cl.
*G11C 16/06*  (2006.01)
(52) U.S. Cl. ................................. 365/185.2; 365/185.21
(58) Field of Classification Search .............. 365/185.2, 365/185.21, 185.18, 185.08, 185.05, 185.11
See application file for complete search history.

(56) References Cited

U.S. PATENT DOCUMENTS

| | | | |
|---|---|---|---|
| 6,038,190 A * | 3/2000 | Kowalski et al. | 365/228 |
| 6,301,156 B1 | 10/2001 | Kurosaki | |
| 7,173,856 B2 * | 2/2007 | Vali et al. | 365/185.21 |
| 7,227,789 B2 * | 6/2007 | Vali et al. | 365/189.05 |
| 7,508,706 B2 * | 3/2009 | Tsuruda | 365/185.08 |
| 2005/0169078 A1 | 8/2005 | Balasubramanian et al. | |
| 2005/0286323 A1 | 12/2005 | Ohtsuki et al. | |

OTHER PUBLICATIONS

Mano, Morris M. "Logic and Computer Design Fundamentals" 2nd Edition, 2001, Prentice-Hall, Inc, Upper Saddle River, New Jersey 07458, XP002477393.
European Search Report issued in corresponding application No. EP 07 15 0366, completed Apr. 21, 2008.

* cited by examiner

*Primary Examiner*—Anh Phung
*Assistant Examiner*—Hien N Nguyen
(74) *Attorney, Agent, or Firm*—Griffin & Szipl, P.C.

(57) ABSTRACT

The reading device enables a non-volatile memory consisting of a matrix of memory cells ($T_M$) to be read. Once the memory cells have been selected to be read in a read cycle controlled by a microprocessor unit, sense amplifiers (4) activated at the start of each cycle supply a binary data word (dx) representing the reading of the selected memory cells. The reading device also comprises time-lag means (3, $M_F$, $T_F$, $C_{gap}$) activated at the start of each read cycle. These time-lag means supply a reference signal (rd_mon) that controls the read time of the cells selected independently of the microprocessor unit. This read time is determined so that it is sufficient for reading all the valid data of the selected memory cells in each read cycle.

11 Claims, 4 Drawing Sheets

DEVICE FOR READING A LOW-CONSUMPTION NON-VOLATILE MEMORY AND ITS IMPLEMENTING METHOD

This application claims priority from European Patent Application No. 07150366.8 filed Dec. 21, 2007, the entire disclosure of which is incorporated herein by reference.

FIELD OF THE INVENTION

The invention relates to a device for reading a low-consumption non-volatile memory that allows each read cycle to be properly supervised. The device comprises means for addressing rows of the memory matrix and means for addressing columns of the memory matrix to select memory cells to be read in a read cycle. The device also comprises sense amplifiers, each of which is connected to a respective memory cell for reading a column selected by the column addressing means. All the sense amplifiers are activated at the beginning of a read cycle controlled by a microprocessor unit in order to supply a binary data word representing the reading of the selected memory cells.

The invention also relates to a method for implementing the reading device.

The reading device can be used to supervise reading of any type of non-volatile memory consisting of a matrix of memory cells. For example, this can be an EEPROM, flash or other type of memory.

BACKGROUND OF THE INVENTION

In general, to be able to read a non-volatile memory cell it is necessary to make a comparison of the current of this memory cell with a reference current. This operation is performed by a circuit defined as a sense amplifier. The reference current is generated by a reference memory cell, for example. Using a current mirror array, this generates a current during each reading, which lies in the middle between the value of the current corresponding to a programmed cell and that of an erased cell. To reduce the consumption current, it is conceivable to reduce the reference current injected into the sense amplifiers. However, a drawback of this method is that the reading access time is increased.

Reading a non-volatile memory such as a NOR flash memory, for example, consumes a static current for as long as the sense amplifier is in operation. This represents another drawback, since the power consumption of such a reading device remains relatively significant particularly in the case when the frequency of memory access by a microprocessor unit decreases.

A non-volatile memory device such as a flash memory is described in the patent document U.S. Pat. No. 6,301,156. This device allows execution of a program verification based on a change in charged or discharged current of capacitors connected to a bit line of a memory cell to be read and a bit line of a reference cell. A sense amplifier allows the output signals of the memory cell network to be compared with the output signals of the reference cell. This sense amplifier thus allows detection of a difference in potential of the charge rate of each capacitor output from the network and output from the reference cell to determine a state of a selected memory cell.

However, a major portion of the electronic components of the memory device of this patent U.S. Pat. No. 6,301,156 remains in operation during each verification or read cycle, and this represents a drawback.

In contrast, patent document US 2005/0169078 describes a reading device for a memory network, which comprises means to reduce the read time during a read cycle controlled by a microprocessor unit. For this purpose, it comprises time-lag means for the read time in each read cycle initiated by the microprocessor unit. The time-lag means comprise a dummy memory network linked to a reference sense amplifier, which supplies a latch signal to a latch register. This latch register receives data from a selected cell to be read via a sense amplifier. At the end of the read time of all valid data, the latch signal allows the latch register to be closed to retain the data read as output. This latch signal also allows the disconnection of all the sense amplifiers to be controlled before a subsequent read request.

However, in this patent document US 2005/0169078, the read time is not precisely determined in order to reduce the power consumption as far as possible, because the charge of the dummy cell network is not well defined.

SUMMARY OF THE INVENTION

Therefore, the aim of the invention is to provide a device for reading a non-volatile memory that is capable of alleviating the abovementioned drawbacks of the prior art and allowing the read time of such a memory to be optimised in order to reduce power consumption.

In this aim, the invention relates to a device for reading a memory specified above that has the features defined in the independent claim 1.

Particular embodiments of the reading device are defined in dependent claims 2 to 6.

An advantage of the memory reading device lies in the fact that even if the microprocessor unit is clocked at low frequency, the time-lag means can manage the effective read time of all the valid data of the selected memory cells independently of the microprocessor unit.

The invention also relates to a method of implementing the aforementioned reading device that has the features defined in the independent claim 7.

Particular steps of the method for implementing the reading device are defined in independent claims 8 to 10.

An advantage of the method for implementing the reading device lies in the fact that at the instant when the time-lag means is set in operation following the command from the microprocessor unit, the read time is determined solely by the time-lag means independently of the microprocessor unit.

BRIEF DESCRIPTION OF THE DRAWINGS

The aims, advantages and features of the memory reading device and its implementing method will be made clearer in the following description of at least one non-restrictive embodiment illustrated by the attached drawings, wherein.

DETAILED DESCRIPTION OF THE PREFERRED EMBODIMENTS

In the following description, those parts of the memory reading device that are well known to a person skilled in the art are only outlined in simplified form. The non-volatile memory can be of any type, but in the following description only a flash type non-volatile memory will be referred to by preference.

Figure 1:
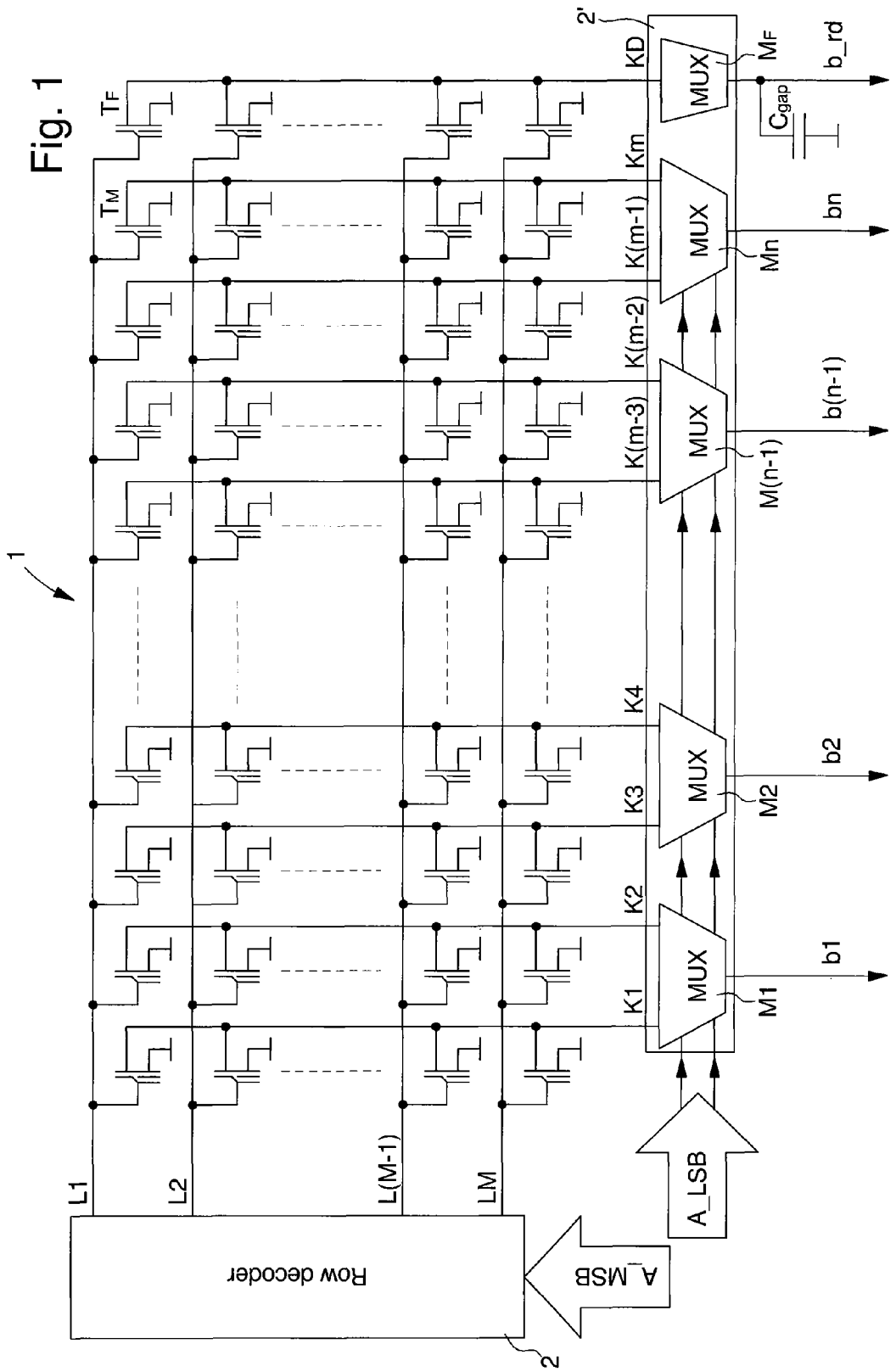
FIG. 1 shows a section of the reading device according to the invention connected directly to the cells of a non-volatile memory.

For reasons of clarity FIG. 1 only shows a simplified part of the reading device. This part of the reading device is connected directly to the matrix of memory cells $T_M$ of a NOR flash type non-volatile memory 1 to enable reading.

The reading device comprises means 2 for addressing rows and means 2' for addressing columns of the matrix 1 of memory cells $T_M$. The row addressing means is a row decoder 2 shown in FIG. 1. This row decoder 2 receives a binary control word A_MSB in particular of a microprocessor unit, which can be part of the reading device, for selection of a read cycle of at least one row L1, L2, L(M-1), LM from M rows of the matrix. The column addressing means 2' mainly comprises n multiplexers M1, M2, M(n-1), Mn controlled by a binary control word A_LSB supplied by the microprocessor unit (not shown). Thus, the microprocessor unit supplies a binary control word, of which the more significant bits can form the binary control word for rows A_MSB, while the less significant bits can form the binary control word for multiplexers A_LSB.

All the n multiplexers M1, M2, M(n-1), Mn are able to output data signals defining n bits b1, b2, b(n-1), bn, e.g. 8 bits, relating to reading selected cells. To achieve this, several columns K1, K2, K3, K4, K(m-3), K(m-2), K(m-1), Km of the matrix are linked to each multiplexer. Each multiplexer is preferably controlled by a binary column address word A_LSB with N bits, wherein N is an integer greater than or equal to 1. Therefore, each multiplexer is linked to a column number 2N in order to link one of these selected columns to one among n sense amplifiers explained below with reference to FIG. 2. For example, it is conceivable to link 4 columns to each multiplexer controlled by a 2-bit address word, even though only 2 columns are shown per multiplexer in FIG. 1 for reasons of simplicity.

The reading device also comprises at least one dummy cell $T_F$ linked to the column addressing means 2' that has a multiplexer structure $M_F$ equivalent to other multiplexers M1 to Mn. The multiplexer $M_F$ supplies an output signal b_rd to a reference sense amplifier explained with reference to FIG. 2. A column KD of dummy cells of a number equal to the number of memory cells of each other column is preferably provided. Moreover, the dummy cells of each column can be fully matched to the memory cells of each other column to define an equivalent parasitic capacitor of each column in read phase.

The column KD of dummy cells $T_F$ forms part of time-lag means of the reading device that is able to define a determined read time of valid data of selected memory cells. This determined read time of the time-lag means is dependent on a time-lag capacitor $C_{gap}$ of the time-lag means. This time-lag capacitor is connected at one end to the column of dummy cells KD and at the other end to earth.

On the basis of the determined capacitance of the time-lag capacitor, the read time initiated by the microprocessor unit in each read cycle is always defined to be slightly more than the read time of valid data of any selected memory cell. This allows the power consumption of the reading device to be significantly reduced by defining the read time by the time-lag means independently of the microprocessor unit, as explained below with reference to FIG. 2.

Each memory cell $T_M$ of the matrix 1 as well as each dummy cell $T_F$ are composed of a floating-gate transistor. All the transistors $T_M$ of the same row L1, L2, L(M-1), LM of the memory matrix have their linked gate. The source of each transistor is connected to earth, for example, while the drains of all the transistors of the same column K1, K2, K3, K4, K(m-3), K(m-2), K(m-1), Km of the matrix 1 are linked together. The gate of each dummy transistor $T_F$ can also be linked to each corresponding row of the memory matrix. The source of the dummy transistors $T_F$ is also linked to earth, while the drains of all the dummy transistors of column KD are all linked to the multiplexer $M_F$.

The row decoder 2 can thus select one of the transistor rows by applying a sufficient voltage above earth at each gate of the transistors of the same row. This gate voltage must be higher than the threshold voltage of the transistor to make said transistor of the memory cell conductive in the case where the cell is in a state "1" representing an erased cell. Conversely, in the case where the cell is in a state "0" indicative of a programmed cell, the transistor $T_M$ having a charged floating gate is considered as non-conductive with only a weak stray current passing through it in read phase.

To understand the operation of the reading device with the time-lag means, reference will now be made to the elements shown in FIG. 2 and to the graphs of some signals over time shown in FIG. 5.

Figure 2:
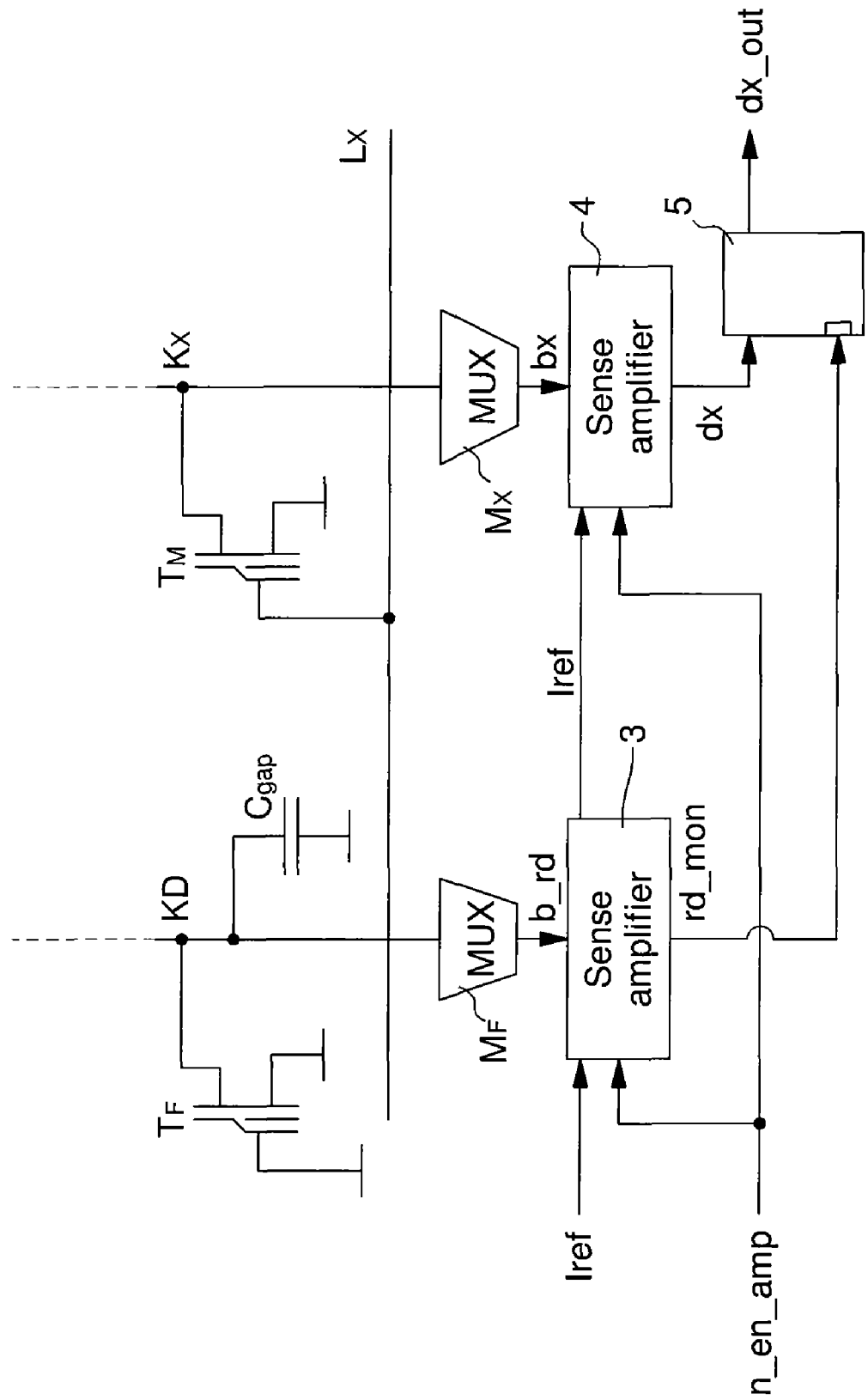
FIG. 2 shows that elements of the reading device according to the invention in a simplified manner with the time-lag means for reading a selected memory cell and latching the data of this cell.

For simplification purposes, FIG. 2 shows only a transistor $T_F$ of a dummy cell forming part of a column KD of dummy cells and a transistor $T_M$ of a selected memory cell on a row Lx of a column Kx selected by the multiplexer Mx. In this FIG. 2 it is conceivable to link the gate of each transistor $T_F$ of the dummy cells directly to earth. Each transistor of the dummy cells must be in a non-conductive state to determine a read time in each read cycle in conjunction with the time-lag capacitor Cgap connected to earth.

At the start of each read cycle controlled by the ascending flank of a read signal of the microprocessor unit (not shown) all the sense amplifiers 4 as well as the reference sense amplifier 3 of the time-lag means are activated by the control signal n_en_amp. This signal n_en_amp shifts from a state "1" of a high voltage of a voltage supply source, for example, to a state "0" close to earth at the start of each cycle. A mean reference current Iref is also supplied by a current mirror structure to each sense amplifier, which will be explained in more detail below with reference to FIGS. 3a and 3b.

The data of the selected memory cell $T_M$ can be read from the instant the sense amplifiers 4 and the reference sense amplifier 3 are activated.

If the memory cell is programmed in the state "0", the transistor is non-conductive and behaves like a parasitic capacitor connected at one end to earth in conjunction with other non-selected transistors of the same column Kx. This parasitic capacitor is in a discharged state at the start of each read cycle and once activated, the sense amplifier 4 will charge the parasitic capacitor using a current higher than the mean reference current Iref. In this charge phase, the sense amplifier supplies a data signal dx in state "1" output from a buffer element. After a known charge time, the sense amplifier 4 will supply a data signal dx shifting from state "1" to state "0".

If the memory cell is erased in state "1", the transistor $T_M$ becomes conductive in conjunction with the sense amplifier 4. In this case, the sense amplifier 4 supplies a data signal dx always in state "1" for the entire read time.

The time-lag means of the reading device consist of at least one dummy cell $T_F$, the capacitor $C_{gap}$, the multiplexer $M_F$ and the detection sense amplifier 3. In order to define a parasitic capacitor equivalent to each column Kx of selected memory cells, it is preferable to have a column KD of dummy cells matched to the other memory cell columns. The number of dummy cells is equal to the number of memory cells of each other column.

The reference sense amplifier 3 is connected to the time-lag capacitor $C_{gap}$ and the transistor $T_F$ of the dummy cell by means of the multiplexer $M_F$. Since the dummy transistor of the dummy cell is non-conductive, it behaves like a parasitic capacitor that is connected on one side to earth. This parasitic capacitor connected in parallel to the time-lag capacitor allows a determined read time to be defined that is greater than the read time of any valid data of each selected memory cell.

As such, like at the start of each read cycle, the time-lag capacitor and the parasitic capacitor are in discharged state, the reference sense amplifier 3 will supply a charging current to the two capacitors for the entire determined read period. During this charge phase, the reference sense amplifier 3 outputs a reference signal rd_mon which is in state "1". Once the capacitors are charged to a voltage level where the charging current becomes equal to the reference current Iref, this reference signal shifts from state "1" to state "0" after a well defined period. The shift from state "1" to state "0" of the reference signal rd_mon occurs after a duration tl above the maximum read time of any valid data of whatever selected memory cell. This duration tl is mainly defined by the capacitance of the time-lag capacitor $C_{gap}$.

This reference signal rd_mon allows the end of the read period to be controlled independently of the microprocessor unit after it has been possible to read all the valid data of the selected memory cells. For this, the reference signal rd_mon controls a locking or latch register 5, which is in an open state to allow passage of the data signal dx and store the data dx_out in output, while this reference signal is in state "1". Once the reference signal rd_mon shifts from state "1" to state "0" to determine the end of the read period, all the valid data d_out read from all the selected memory cells are latched as output of the latch register 5.

Because of these time-lag means, this allows the deactivation of all the sense amplifiers 4 and the reference sense amplifier 3 to be controlled independently of the microprocessor unit at the end of the read time. Even if the microprocessor unit is set by clock signals at a low frequency, e.g. at a clock frequency in the order of 32 kHz, this has no influence on the read time defined by the time-lag means in each read cycle. This allows the power consumption of the reading device in the reading phase to be reduced substantially. Moreover, even if the microprocessor unit is set by clock signals at a high frequency, e.g. in the order of 5 MHz, each new read cycle would not be able to start until the read time determined by the time-lag means has finished.

Figure 3A:
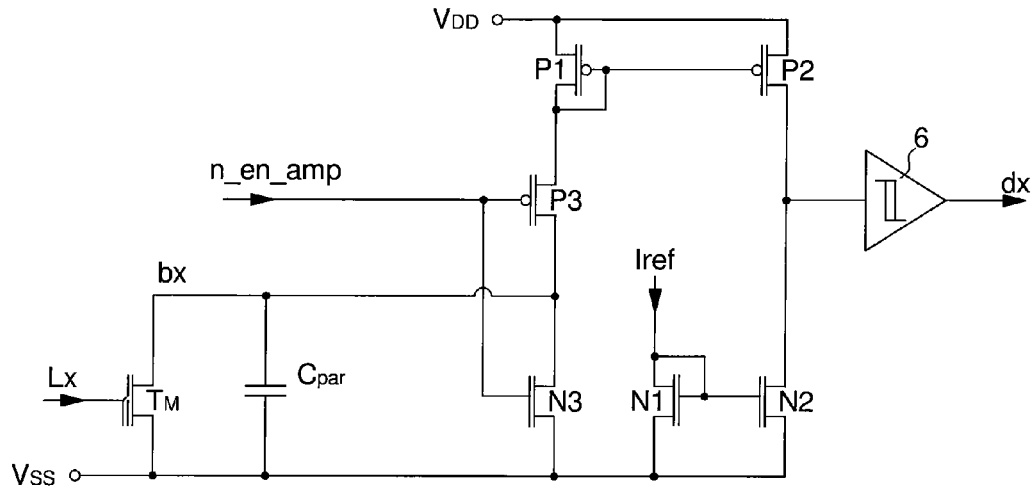
FIG. 3a shows an embodiment of a sense amplifier of the reading device according to the invention for reading a selected memory cell.
Figure 3B:
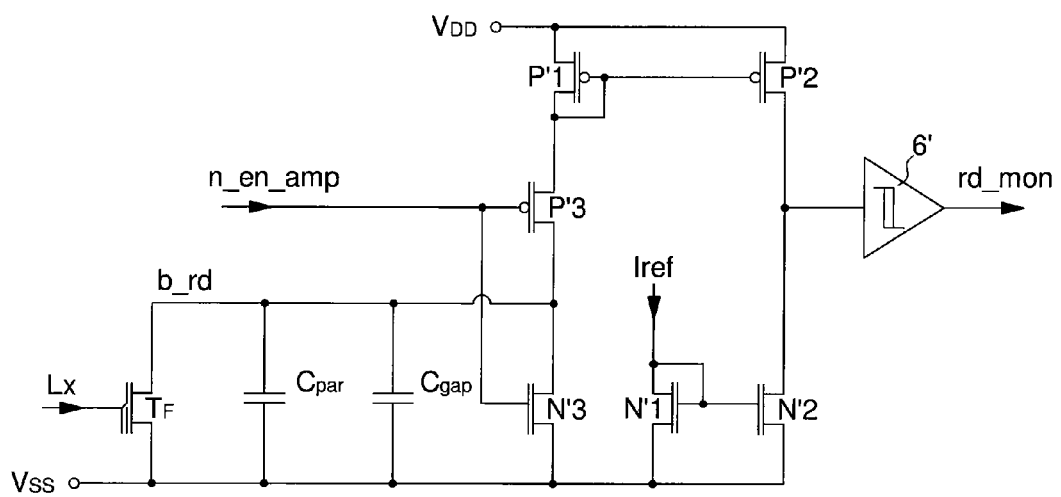
FIG. 3b shows an embodiment of a reference sense amplifier linked to at least one dummy cell and a capacitor of the time-lag means.

FIGS. 3a and 3b show an embodiment of a sense amplifier connected to a transistor $T_M$ of a memory cell to be read as well as an embodiment of the reference sense amplifier of identical structure connected to a transistor $T_F$ of a dummy cell. In the interests of simplification, the multiplexer interposed between each amplifier and the memory or dummy cell is not represented.

In FIG. 3a the sense amplifier comprises a first current mirror N1 and N2 to mirror the reference current Iref in a comparison branch. This first current mirror consists of NMOS type transistors. The first NMOS transistor N1 has its source terminal connected to earth $V_{SS}$ and its gate and drain terminals connected together to receive the reference current Iref. The second NMOS transistor N2 is connected by its gate terminal to the gate terminal of the first transistor and its source terminal connected to earth $V_{SS}$. The current Iref is normally mirrored to pass between the drain terminal and the source terminal in this second transistor N2.

The sense amplifier also comprises a second current mirror formed from two PMOS type transistors P1 and P2. The first PMOS transistor P1 has its source terminal connected to the high voltage terminal $V_{DD}$ of a voltage supply source that can also be a regulated voltage. The gate and drain terminals of the first PMOS transistor P1 are connected together for generation of a current to be mirrored in the second PMOS transistor P2. This second PMOS transistor P2 has its source terminal connected to the high voltage terminal $V_{DD}$ and its gate terminal connected to the gate terminal of the first PMOS transistor P1. The drain terminal of the second PMOS transistor P2 is connected to the drain terminal of the second NMOS transistor N2 to define a current comparison branch.

The connection node of the PMOS transistor P2 and NMOS transistor N2 is connected to a buffer element 6 to output a data signal dx. This buffer element 6 can be a well-known bistable circuit (Schmitt Trigger).

The sense amplifier also comprises an inverter stage composed of the third PMOS transistor P3 and the third NMOS transistor N3 assembled in series. The gate terminals of the third transistors P3 and N3 are connected together to receive the control signal n_en_amp to activate or deactivate the sense amplifier. The source terminal of the third PMOS transistor P3 is connected directly to the gate and drain terminals of the first PMOS transistor P1. The source terminal of the third NMOS transistor N3 is connected directly to earth $V_{SS}$. The connection node of the two drain terminals of the third transistors P3 and N3 is connected to a selected memory cell $T_M$ to be read.

This memory cell can be a traditional floating-gate transistor $T_M$, in which the source terminal is connected to earth and the drain terminal is connected to the connection node of the third transistors. A parasitic capacitor Cpar is shown in parallel with this transistor in relation to the assembly of elements of the selected memory column. This floating-gate transistor is controlled at its gate by a row selection voltage Lx.

In the case where the memory cell is erased in a state "1", the floating-gate transistor is conductive. At the start of a read cycle, the control signal n_en_amp shifts from a state "1" to a state "0" close to earth $V_{SS}$, which causes the third PMOS transistor P3 to become conductive to connect the first PMOS transistor P1 to the selected memory cell. Since the floating-gate transistor $T_M$ of the memory cell is conductive, a current is generated between the first PMOS transistor P1 and the floating-gate transistor with a well defined value. This generated current can thus be mirrored by the first PMOS transistor P1 in the second PMOS transistor P2. This current mirrored in the second current mirror is higher than the reference current Iref and this causes the connection node of the second transistors P2 and N2 to be in the high state "1" to represent the data dx in state "1" representing the read data of the memory cell. The value of the reference current Iref can be defined as half the value of the mirrored current for an erased read memory cell.

In the case where the memory cell is programmed in a state "0", the floating-gate transistor is non-conductive. Since the control signal n_en_amp is in the state "1" before the start of the read cycle, the third NMOS transistor N3 completely discharges the parasitic capacitor Cpar. Therefore, for such a programmed memory cell a charging current is generated at the start of the read cycle by the first PMOS transistor P1 connected to the parasitic capacitor $C_{par}$. This charging current is initially higher than the reference current Iref. The consequence of this is that during a certain read time of the data, the output data of the sense amplifier is firstly in state "1". These data shift to state "0" as output as valid data when the parasitic capacitor has been sufficiently charged to a voltage level where the current mirrored in the second PMOS transistor P2 falls below the reference current Iref.

Therefore, it is understood that when the value of the parasitic capacitor is significant, the read time necessary to obtain valid data in output from the sense amplifier is relatively long. Therefore, it is necessary to provide time-lag means to define a total read time for all the memory cells selected that is slightly more than the maximum read time for these cells in the worst case.

In FIG. 3b the reference sense amplifier of the time-lag means is completely identical in structure to the sense amplifier explained with reference to FIG. 3a. This reference sense amplifier therefore comprises a first current mirror formed by two NMOS transistors N'1 and N'2, a second current mirror formed by two PMOS transistors P'1 and P'2, an inverter stage formed by two third PMOS and NMOS transistors P'3 and N'3. Since all these elements are branched in the same manner as the same elements of the sense amplifier explained with reference to FIG. 3a, they will not be explained.

It is naturally conceivable to design the same first current mirror with several second NMOS transistors connected to a single first NMOS transistor N1 or N'1, which receives a reference current Iref to be mirrored in all the second NMOS transistors.

The essential difference with this reference sense amplifier is that it is adapted to be connected to a dummy cell $T_F$, which supplies the signal b_rd with an associated parasitic capacitor Cpar arranged in parallel, and to a time-lag capacitor $C_{gap}$ connected in parallel to the parasitic capacitor. Since the dummy cell is in a non-conductive state in the read phase, a charge of the two capacitors initially discharged by the third NMOS transistor N'3 must be actuated from the start of the read cycle. The reference signal rd_mon supplied in output from the buffer element 6' is therefore in the state "1" during the entire time-lag period principally by the combination of the parasitic capacitor and the time-lag capacitor. As soon as the capacitors are sufficiently charged to a voltage level where the current mirrored in the second PMOS transistor P'2 falls below the reference current Iref mirrored in the second NMOS transistor N'2, the reference signal rd_mon shifts to the state "0".

The shift from state "1" to state "0" of the reference signal rd_mon determines the end of the read time of all the valid data of the memory cells selected. Since the parasitic capacitor $C_{par}$ of the column of dummy cells has a value close to the capacitance of a parasitic capacitor of a selected memory column, it is possible to readily define the additional period for reading all the valid data by means of the time-lag capacitor $C_{gap}$.

Figure 4:
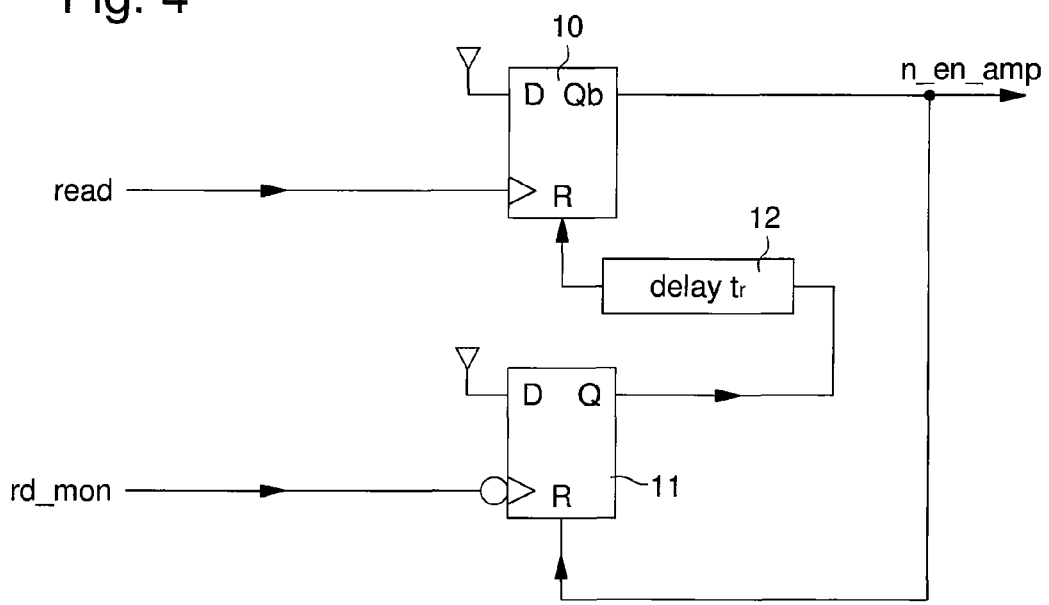
FIG. 4 shows a simplified view of a logic circuit controlled by the time-lag means for deactivating the sense amplifiers of the reading device according to the invention.

Normally, when the reference signal rd_mon shifts from the state "1" to state "0", all the sense amplifiers as well as the reference sense amplifier must be deactivated. However, to ensure that all the data supplied in the latch register explained with reference to FIG. 2 are properly stored in this register, a delay of deactivation of said amplifiers must be defined. FIG. 4 shows a logic circuit that enables a control signal n_en_amp to be supplied, the state of which signal changes after a certain delay tr following the end of the read time defined by the reference signal rd_mon.

The logic circuit includes a first D type flip-flop 10, a second D type flip-flop 11 and a delay circuit 12 arranged between the output Q of the second flip-flop 11 and a zero reset input R of the first flip-flop 10. Each D input of the two flip-flops 10 and 11 is positioned at state "1", i.e. at a high voltage of a supply voltage source, for example.

Figure 5:
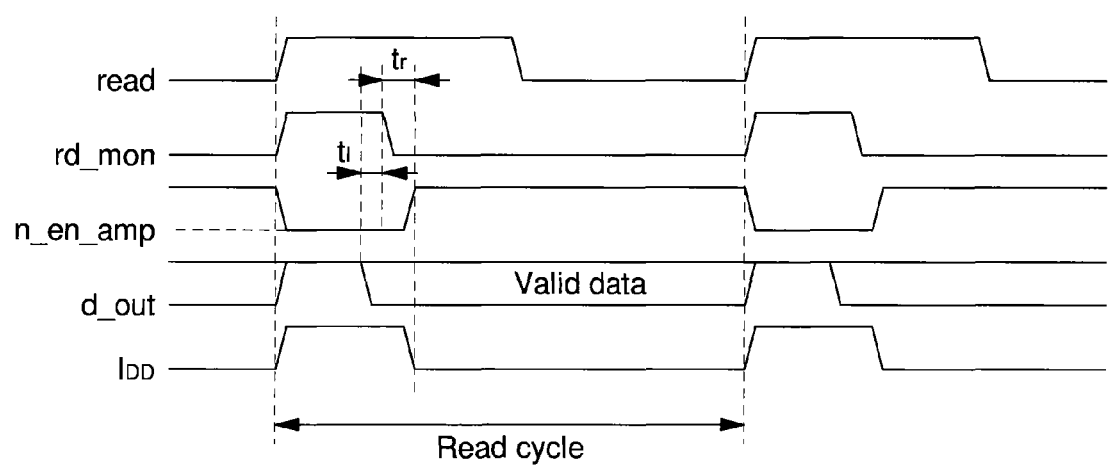
FIG. 5 shows a graph of the state of certain signals over time of the reading device in each read cycle.

At the start of each read cycle, as also shown in FIG. 5, the read signal is supplied by the microprocessor unit that controls the start of each read cycle. The ascending flank of this read signal allows the first flip-flop 10 to be controlled so that the inverted output Qb shifts from state "1" to state "0", which causes the control signal n_en_amp, which was initially in state "1", to shift to state "0". The output of the second flip-flop at the start of the read cycle remains in state "0" without change because the reference signal rd_mon is supplied at an inverted control input of the second flip-flop 11. The reference signal rd_mon shifts from the state "0" to state "1" at the start of the read cycle, which does not cause any change at the output Q of the second flip-flop.

At the end of the read time determined by the time-lag means, the reference signal rd_mon will shift from the state "1" to state "0", which will actuate a change of the output signal Q at the inverted control input of the second flip-flop. This change of state of the output Q of the second flip-flop, which constitutes an ascending flank, is only supplied to the zero reset input R of the first flip-flop 10 after a delay tr defined by a well-known delay circuit 12. The ascending flank of the delayed signal supplied to the zero reset input R of the first flip-flop causes the control signal n_en_amp to be shifted from the state "0" to state "1", in which the sense amplifiers and the reference sense amplifier are deactivated. The shift from the state "0" to state "1" of this control signal n_en_amp allows the shift of the output Q from the state "1" to state "0" to be actuated at the zero reset input R of the second flip-flop 11 to await a new read cycle.

Once the sense amplifiers and reference sense amplifier are deactivated, the current $I_{DD}$ of the reading device is greatly reduced as shown in FIG. 5. It is also conceivable to switch off the source of the reference current Iref (not shown) at the end of each read time. This is a significant advantage of the reading device, since in the case where the microprocessor unit is set by a clock signal at low frequency, each read cycle is relatively long. Therefore, the time-lag means of the reading device allow a read time to be defined that is much less than the duration of each read cycle.

All the elements described above can be integrated onto the same chip configured using the standard CMOS technology. The reading device can be supplied with a voltage of between 2 and 5.5 V by a voltage supply source.

On the basis of the above description a plurality of variants of the reading device and its implementing method can be conceived by a person skilled in the art without departing from the scope of the invention as defined by the claims. Another time-lag means with several programmable capacitors dependent on the expected read time can be envisaged. The programming of the network of time-lag capacitors can be conducted under control of the microprocessor unit time-lag means in the form of a monoflop are also conceivable.

What is claimed is:

1. A device for reading a non-volatile memory, which consists of a matrix of memory cells, said device including means for addressing rows of the memory matrix to select at least one row of memory cells, means for addressing columns of the memory matrix to select columns for reading memory cells of the columns selected on a selected memory row in a read cycle controlled by a microprocessor unit, sense amplifiers, each connected to a respective memory cell for reading a column selected by the column addressing means, wherein all the sense amplifiers that are activated at the beginning of a read cycle by the microprocessor unit supply a binary data word representing the reading of the selected memory cells, comprising time-lag means activated at the beginning of each read cycle to supply a reference signal to control the read time of cells selected independently of the microprocessor unit, wherein this read time is determined to be sufficient to read all the valid data of the selected memory cells in each read cycle, wherein the time-lag means include a column of dummy reference cells that are programmed and matched to the memory cells of each column of the non-volatile memory, the column of dummy cells being connected by means of the column addressing means to a reference sense amplifier, which supplies the reference signal, and a time-lag capacitor connected to the column of dummy cells programmed to be non-conductive, which defines a parasitic capacitor combined with the time-lag capacitor having a determined capacitance to define the desired read time.

2. The reading device according to claim 1, characterised in that the reference sense amplifier supplies a reference signal, which is in a first state at the beginning of each read cycle controlled by the microprocessor unit when the time-lag capacitor connected with the parasitic capacitor linked to the dummy cell is in charge phase, and in a second state as soon as the time-lag capacitor in association with the parasitic capacitor are charged after a determined time lapse, wherein the shift from the first state to the second state of the reference signal controls the end of the read time of each read cycle.

3. The reading device according to claim 1, wherein the reference signal controls the storage in a latch register of the valid data of the selected memory cells.

4. The reading device according to claim 2, wherein the sense amplifiers are deactivated by an output signal of a logic circuit following the shift from the first state to the second state of the reference signal supplied in input from the logic circuit.

5. The reading device according to claim 4, wherein the logic circuit comprises a first D type flip-flop supplying the output signal of the logic circuit, a second D type flip-flop and a delay circuit arranged between the output of the second flip-flop controlled by the reference signal and a zero reset input of the first flip-flop controlled by a read cycle start signal supplied by a microprocessor unit, wherein the delay circuit allows the deactivation of the sense amplifiers to be delayed following the change in state of the reference signal.

6. The reading device according to claim 1, wherein the column addressing means comprises a number of multiplexers equivalent to the number of sense amplifiers, wherein each multiplexer is controlled by a binary word for addressing columns of N bits, wherein N is an integer greater than or equal to 1, and each being linked to a column number 2N in order to link one of these columns to a respective operating sense amplifier dependent on the binary word of address for reading the selected memory cells.

7. The method for implementing a device for reading a non-volatile memory according to claim 1, wherein for each read cycle controlled by a microprocessor unit it comprises the following steps:

activating each sense amplifier at the start of each read cycle by a cycle start signal supplied by the microprocessor unit, selecting a row and columns of memory cells to be read, wherein each selected column is linked to a respective sense amplifier, and activating the time-lag means, reading the data of the selected memory cells by means of the sense amplifiers to supply a binary data word of the selected memory cells, controlling the end of the read time in the read cycle by a reference signal supplied by the time-lag means independently of the microprocessor unit, wherein said read time is determined so that it is sufficient to read all the valid data of the selected memory cells in each read cycle.

8. The method according to claim 7, in which the time-lag means comprise a column of dummy cells that are programmed and matched to the memory cells of each column of the non-volatile memory, wherein the column of dummy cells defines a parasitic capacitor combined with a time-lag capacitor to define the desired read time, and the column of dummy cells is linked to a reference sense amplifier, which supplies the reference signal, wherein each sense amplifier is deactivated at the end of the read time on the basis of the reference signal, wherein said reference signal shifts from a first state during the read time, in which the parasitic capacitor and the time-lag capacitor are in charge phase by means of a current supplied by the reference sense amplifier, to a second state in which the capacitors are charged.

9. The method according to claim 7, wherein during the read time the reference signal controls the storage in a latch register of the valid data of the selected memory cells.

10. The method according to claim 7, wherein the sense amplifiers are deactivated by an output signal of a logic circuit following the shift from the first state to the second state of the reference signal supplied in input from the logic circuit, wherein said logic circuit has a delay circuit to delay the deactivation of the sense amplifiers following the change of state of the reference signal.

11. The method according to claim 8, wherein during the read time the reference signal controls the storage in a latch register of the valid data of the selected memory cells.

* * * * *